(12) United States Patent
Yun (10) Patent No.: US 10,320,105 B2
(45) Date of Patent: Jun. 11, 2019

(54) PRINTED CIRCUIT BOARDS AND SOLID STATE DRIVES INCLUDING THE SAME

(71) Applicant: Samsung Electronics Co., Ltd., Suwon-si, Gyeonggi-do (KR)

(72) Inventor: Ilhan Yun, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/785,571

(22) Filed: Oct. 17, 2017

(65) Prior Publication Data

US 2018/0109023 A1 Apr. 19, 2018

(30) Foreign Application Priority Data

Oct. 17, 2016 (KR) .................. 10-2016-0134500

(51) Int. Cl.
| | |
|---|---|
| *H05K 5/00* | (2006.01) |
| *H01R 12/72* | (2011.01) |
| *H01R 12/70* | (2011.01) |
| *H05K 1/11* | (2006.01) |
| *H05K 1/18* | (2006.01) |

(52) U.S. Cl.
CPC ....... *H01R 12/724* (2013.01); *H01R 12/7005* (2013.01); *H01R 12/725* (2013.01); *H05K 1/111* (2013.01); *H05K 1/117* (2013.01); *H05K 1/181* (2013.01); *H05K 5/00* (2013.01); *H05K 2201/09036* (2013.01); *H05K 2201/10159* (2013.01); *H05K 2201/10189* (2013.01); *H05K 2201/10325* (2013.01); *H05K 2201/10522* (2013.01); *Y02P 70/611* (2015.11)

(58) Field of Classification Search
None
See application file for complete search history.

(56) References Cited

U.S. PATENT DOCUMENTS

| | | | | |
|---|---|---|---|---|
| 5,242,310 A | * | 9/1993 | Leung | H05K 5/0269 235/492 |
| 5,768,110 A | * | 6/1998 | Frommer | H05K 5/0269 174/365 |
| 5,923,026 A | * | 7/1999 | Onoda | G06K 19/077 235/486 |

(Continued)

FOREIGN PATENT DOCUMENTS

| | | |
|---|---|---|
| KR | 0441153 | 7/2008 |
| KR | 0925991 | 3/2009 |

*Primary Examiner* — Courtney L Smith
*Assistant Examiner* — Rashen E Morrison
(74) *Attorney, Agent, or Firm* — Myers Bigel, P.A.

(57) ABSTRACT

Printed circuit boards and solid state drives including the same are provided. The printed circuit boards may include a base portion including chip pads that are configured to be connected to semiconductor chips, an edge portion extending from one side of the base portion and including interface pads, guide portions, and protrusions. Each of the guide portions may protrude from a respective one of opposing ends of the edge portion in a first direction and may have a first width, and the guide portions may be spaced apart from each other. Each of the protrusions may protrude from a respective one of the guide portions and may have a second width that is less than the first width. A distance between the protrusions may be substantially equal to a distance between the guide portions.

20 Claims, 9 Drawing Sheets

(56) References Cited

U.S. PATENT DOCUMENTS

| | | | |
|---|---|---|---|
| 6,324,076 B1 * | 11/2001 | Gerrits | H05K 5/0269 361/737 |
| 6,905,073 B2 * | 6/2005 | Gerrits | G06K 19/077 235/487 |
| 8,007,289 B2 | 8/2011 | Bandhu et al. | |
| 8,200,861 B2 | 6/2012 | Davis et al. | |
| 8,342,886 B2 | 1/2013 | Zhang et al. | |
| 8,702,451 B2 | 4/2014 | Luo et al. | |
| 8,951,070 B1 | 2/2015 | Goodwin | |
| 2011/0026214 A1 | 2/2011 | Matsumoto et al. | |
| 2015/0319861 A1 | 11/2015 | Bandhu et al. | |
| 2016/0113116 A1 | 4/2016 | Kay | |

\* cited by examiner

PRINTED CIRCUIT BOARDS AND SOLID STATE DRIVES INCLUDING THE SAME

CROSS-REFERENCE TO RELATED APPLICATION

This U.S. non-provisional patent application claims priority under 35 U.S.C. § 119 to Korean Patent Application No. 10-2016-0134500 filed on Oct. 17, 2016, the disclosure of which is hereby incorporated by reference in its entirety.

BACKGROUND

The present disclosure relates to printed circuit boards and solid state drives including the same, and more particularly, to printed circuit boards and solid state drives including the same which are more stably engaged with an interface connector.

With the advent of the information society, the amount of personal data to be stored and transferred has risen explosively. Due to the increasing demand for such data storage devices, various kinds of personal external storage devices are under development. An external storage device is configured with a single storage device, communicated with a host device, and also stores or read data in response to a command of the host device.

Memory devices, such as solid state drives (SSDs), using nonvolatile semiconductor devices have recently gradually begun replacing hard disk drives (HDDs).

SUMMARY

Embodiments of the present inventive concepts provide a printed circuit board that can be stably engaged with an interface connector.

Embodiments of the present inventive concepts provide a solid state drive inducing a printed circuit board that can be stably engaged with an interface connector.

An object of the present inventive concepts is not limited to the above-mentioned one, and other objects which have not been mentioned above will be clearly understood to those skilled in the art from the following description.

According to example embodiments of the present inventive concepts, a printed circuit board may include a base portion including chip pads that are configured to be connected to semiconductor chips, an edge portion extending from one side of the base portion and including interface pads, guide portions, and protrusions. Each of the guide portions may protrude from a respective one of opposing ends of the edge portion in a first direction and may have a first width, and the guide portions may be spaced apart from each other. Each of the protrusions may protrude from a respective one of the guide portions and may have a second width that is less than the first width. A distance between the protrusions may be substantially equal to a distance between the guide portions.

According to example embodiments of the present inventive concepts, a solid state drive may include a printed circuit board. The printed circuit board may include a base portion, an edge portion on one side of the base portion, guide portions, and protrusions. Each of the guide portions may protrude from a respective one of opposing ends of the edge portion in a first direction, and the guide portions may be spaced apart from each other. Each of the protrusions may protrude from a respective one of the guide portions in the first direction. The solid state drive may also include an interface connector connected to the edge portion of the printed circuit board, a plurality of nonvolatile memory chips mounted on the base portion of the printed circuit board, and a controller chip mounted on the base portion of the printed circuit board and electrically connected to the nonvolatile memory chips. The interface connector may include edge tabs, and each of the edge tabs may contact a respective one of the guide portions and a respective one of the protrusions.

According to example embodiments of the present inventive concepts, a printed circuit board may include a base portion including chip pads, an edge portion on one side of the base portion, and two protruding portions defining a recess therebetween. The edge portion may include interface pads. Each of the two protruding portions may protrude from a respective one of opposing ends of the edge portion in a first direction and may include an inner sidewall defining the recess and an outer sidewall opposite the inner sidewall. The inner sidewalls of the two protruding portions may have a first length in the first direction, the outer sidewalls of the two protruding portions may have a second length in the first direction, and the first length may be greater than the second length.

DETAILED DESCRIPTION OF EMBODIMENTS

It will be hereinafter described in detail printed circuit boards and solid state drives including the same according to example embodiments of the present inventive concepts in conjunction with the accompanying drawings.

It will be understood that as used herein the term "and/or" includes any and all combinations of one or more of the associated listed items.

Figure 1:
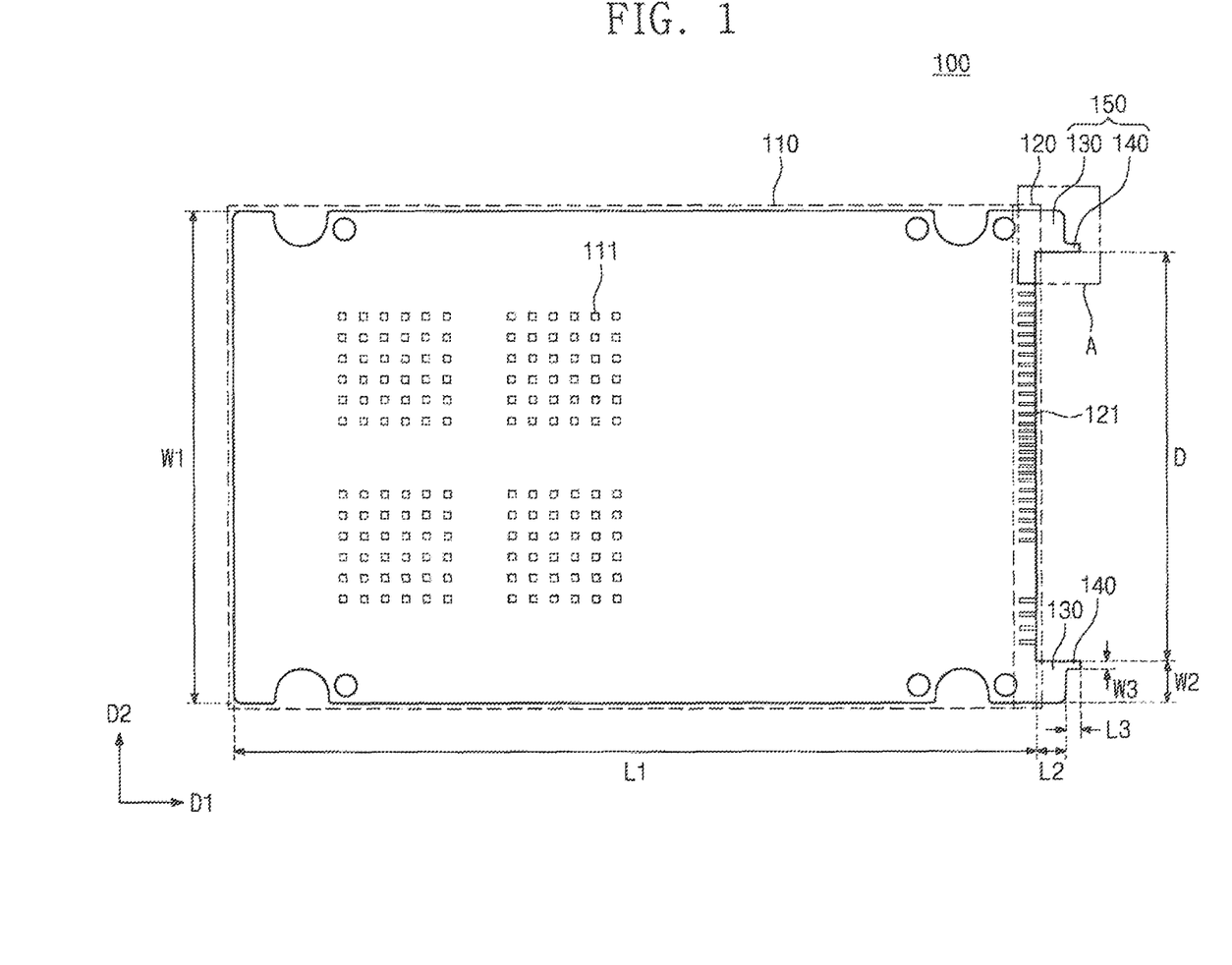
FIG. 1 is a plan view illustrating a printed circuit board according to example embodiments of the present inventive concepts.
Figure 2:
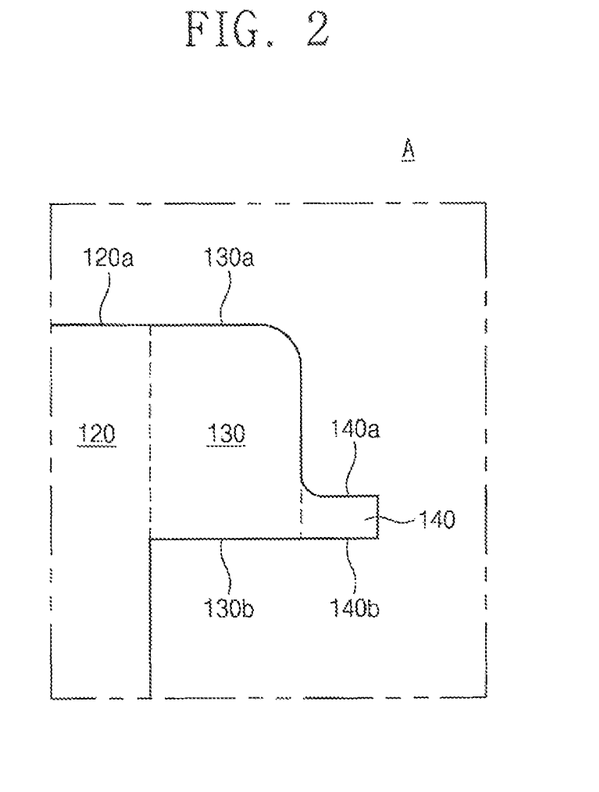
FIG. 2 is an enlarged view of the portion A of the printed circuit board shown in FIG. 1.

FIG. 1 is a plan view illustrating a printed circuit board according to example embodiments of the present inventive concepts. FIG. 2 is an enlarged view of the portion A of the printed circuit board shown in FIG. 1.

Referring to FIGS. 1 and 2, a printed circuit board 180 may include a plurality of vertically stacked insulation layers and internal circuit routings interposed between the insulation layers. The insulation layers may include, for example, a thermosetting resin such as an epoxy resin, a thermoplastic resin such as polyimide, or a resin (e.g., prepreg) including a reinforcing material, such as fiber glass or inorganic filler, that is impregnated with the thermosetting or thermoplastic resin. The internal circuit routings may be composed of, for example, a metallic material such as copper, copper alloy, silver, palladium, platinum, silver-palladium alloy, and nickel.

In some embodiments, the printed circuit board 100 may include a top surface and a bottom surface opposite the top surface, a base portion 110 on which semiconductor chips are mounted, an edge portion 120 at one side of the base portion 110, and guide portions 130 defining a connector interconnecting region where a connector is disposed.

The base portion 110 may be shaped substantially like a rectangle having a first length L1 in a first direction D1 and a first width W1 (i.e., a maximum width) in a second direction D2. In some embodiments, the second direction D2 may be perpendicular to the first direction D1 as illustrated in FIG. 1. The first width W1 may be less than the first length L1. The edge portion 120 may be positioned at one side of the base portion 110 and have a first width W1 substantially the same as that of the base portion 110. Each of the guide portions 130 may protrude in the first direction D1 from one of ends of the edge portion 120 as illustrated in FIG. 1. The guide portions 130 may be spaced apart from each other in the second direction D2. So that the connector interconnecting region may be provided between the guide portions 130. In this configuration, the guide portions 130 may have outer sidewalls 130a substantially coplanar with an outer sidewall 120a of the edge portion 120.

Each of the guide portions 130 may have a second width W2 in the second direction D2. The first width W1 of each of the base portion 110 and the edge portion 120 may correspond to a sum of a distance D between the guide portions 130 and twice the second width W2 of the guide portion 130. In some embodiments, the first width W1 is equal to a sum of the distance D and twice the second width W2 as illustrated in FIG. 1.

In some embodiments, the printed circuit board 100 may further include protrusions 140 each of which protruding in the first direction D1 from one of the guide portions 130. The protrusions 140 may be spaced apart front each other by a distance D substantially the same as that between the guide portions 130. Each of the protrusions 140 may have a third width W3 that is less than the second width W2 of the guide portion 130. The protrusion 140 may have an outer sidewall 140a spaced apart from the outer sidewall 130a of the guide portion 130 and also have an inner sidewall 1401 substantially coplanar with an inner sidewall 130b of the guide, portion 130.

The guide portions 130 may protrude from the edge portion 120 by a second length L2, and the protrusions 140 may protrude from the guide portions 130 by a third length L3 that is less than the second length L2. The third length L3 of the protrusions 140 may be greater than the third width W3 of the protrusions 140. For example, the third length L3 of the protrusions 140 may be in the range from about 1.00 mm to about 1.60 mm, and the third width W3 of the protrusions 140 may be in the range from about 0.80 mm to about 0.90 mm.

In the printed circuit board 100 according to example embodiments, a ratio of the distance D to a sum of the second and third lengths L2 and L3 (i.e., a ratio of length to width of the connector interconnecting region) may be in the range of about 5.0:1 to about 6.0:1. The present inventive concepts are not limited to the above-mentioned ratio; for example, the ratio of the distance D to the sum of the second and third lengths L2 and L3 may be dependent on a ratio of length to width of an interface connector mounted on the printed circuit board 100.

It will be understood that one of the guide portions 130 and a corresponding one of the protrusions 140 may be considered collectively as a protruding portion 150 that protrudes from the edge portion 120 in the first direction D1. It will be also understood that the inner sidewall 130b of the guide portion 130 and the inner sidewall 140b of the protrusion 140 may be considered collectively as an inner sidewall of the protruding portion 150, and the outer sidewall 130a of the guide portion 130 may be considered as an outer sidewall of the protruding portion 150. In some embodiments, a length of the inner sidewall of the protruding portion 150 in the first direction D1 is equal to a sum of the second length L2 and third length L3, and a length of the outer sidewall of the protruding portion 150 in the first direction D1 is the second length 12 as illustrated in FIG. 2. Further, in some embodiments, a length of the protruding portion 150 in the first direction may monotonically decrease from the length of the inner sidewall (i.e., the sum of the second and third lengths L2 and L3) to the length of the outer sidewall (i.e., the second length L2) along a direction from the inner sidewall to the outer sidewall as illustrated in FIG. 2.

The printed circuit board 100 may have chip pads 111, which are connected to semiconductor chips, on top and bottom surfaces of the base portion 110. The chip pads 111 may be electrically connected to the internal circuit routings of the printed circuit board 100.

The printed circuit board 100 may have interface pads 121, which are connected to an interface connector, on a top surface of the edge portion 120. The interface pads 121 may be electrically connected to the internal circuit routings of the printed circuit, board 100. The interface pads 121 may have an arrangement standardized to parallel advanced technology attachment (PATA), serial advanced technology attachment (SATA), eSATA, peripheral component interconnection express (PCIe), small computer system interface (SCSI), serial attached SCSI (SAS), optical fiber channel, gigabit Ethernet, or any other communication standards. In some embodiments, the interface pads 121 may have an arrangement standardized to SAS standard.

Figure 3:
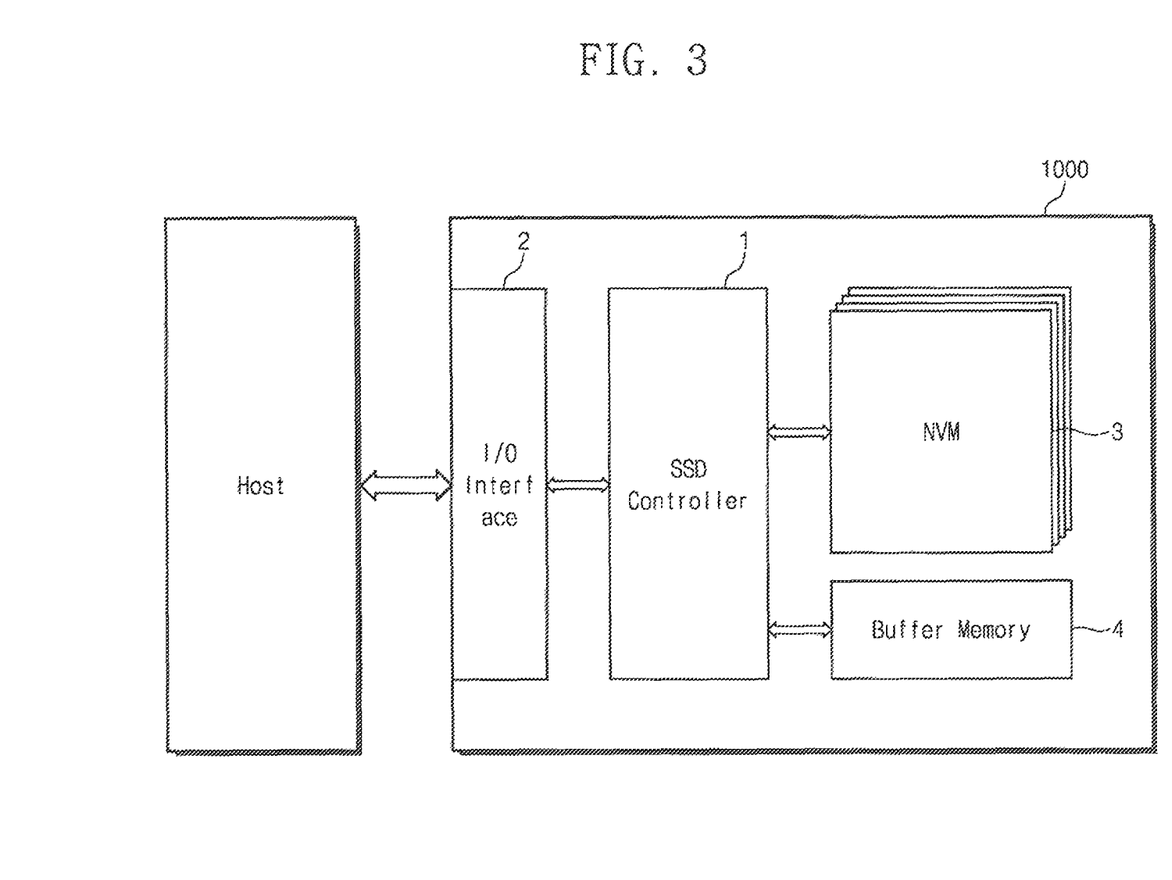
FIG. 3 is a block diagram illustrating a solid state drive according to example embodiments of the present inventive concepts.

FIG. 3 is a block diagram illustrating a solid state drive according to example embodiments of the present inventive concepts.

Referring to FIG. 3, a solid state drive 1000 may store or read data in response to a read/write request from a host (i.e., an external electronic device). The solid state drive 1000 may include an SSD controller 1, an input/output interface 2, a plurality of nonvolatile memory devices 3, and a buffer memory device 4.

The SSD controller 1 may exchange signals with the host through the input/output, interface 2. The signals between the SSD controller 1 and the host may include command, address, data, and so on. The SSD controller 1 may write data in or read data from a corresponding NAND Flash memory in response to a command of the host.

The input/output interface 2 may provide a physical connection between the host and the solid state drive 1000. In other words, the input/output interface 2 may interface with the solid state drive 1000 in response to a bus format of the host. The bus format of the host may be composed of USB (Universal Serial Bus), PCI (Peripheral Component Interconnection) express, SATA (Serial ATA), PATA (Parallel ATA), or the like.

The nonvolatile memory devices 3 may be a NAND Flash memory having a large capacity and a high speed storage capability. In some embodiments, the nonvolatile memory devices 3 may be a phase change random access memory (PRAM), a magnetic random access memory (MRAM), a resistive random access memory (ReRAM), a ferromagnetic random access memory (FRAM), or a NOR Flash memory.

The buffer memory device 4 may temporarily store data communicated between the SSD controller 1 and the nonvolatile memory devices 3 and data communicated between the SDI) controller 1 and the host. In addition, the buffer memory device 4 may also be used to drive software for effectively managing the nonvolatile memory devices 3. The buffer memory device 4 may be composed of, for example, a random access memory such as DRAM or SRAM. In some embodiments, the buffer memory device 4 may be composed of a nonvolatile memory such as Flash memory NAND and NOR), PRAM, MRAM, ReRAM, or FRAM.

Figure 4:
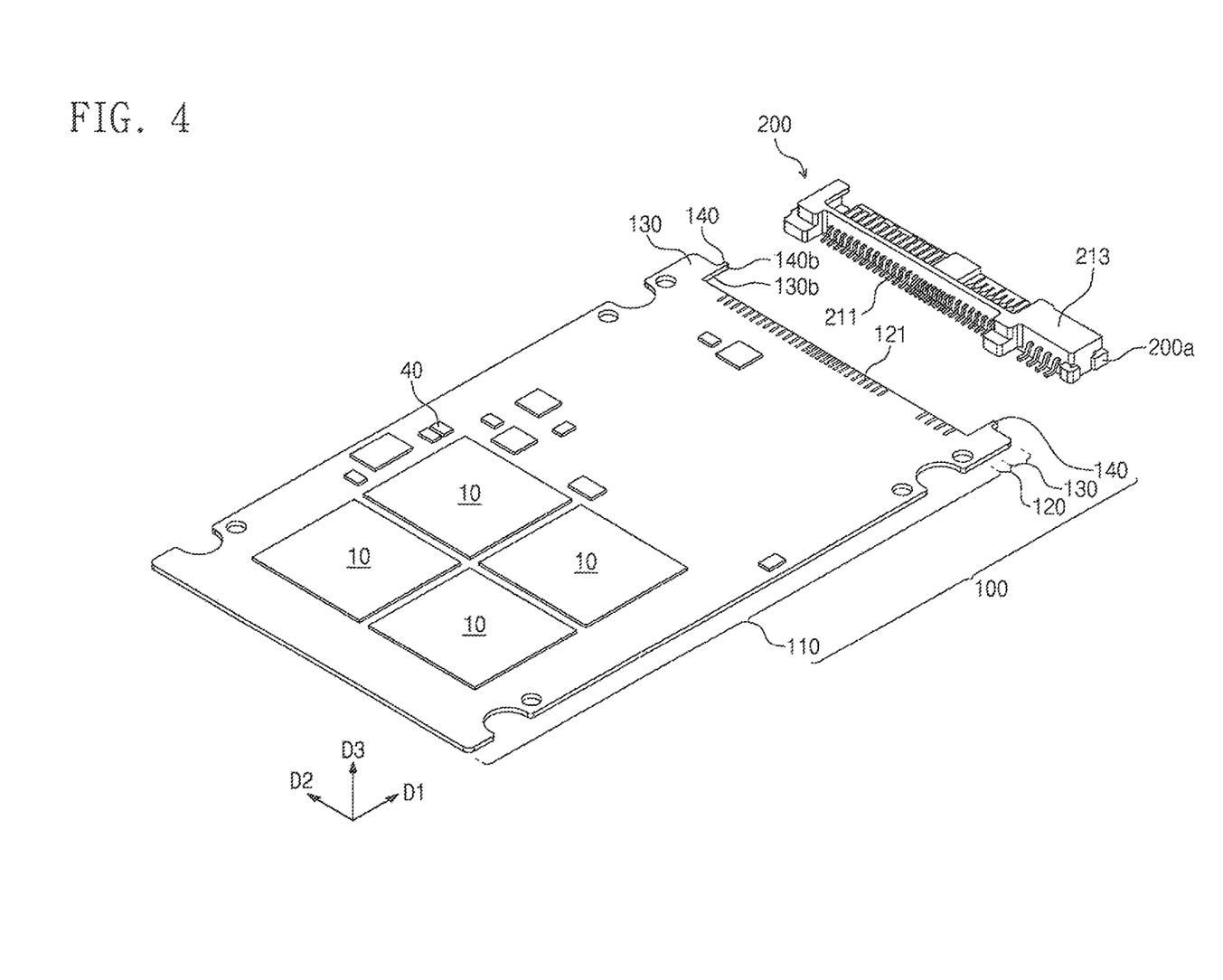
FIG. 4 is an exploded perspective view illustrating a solid state drive according to example embodiments of the present inventive concepts.
Figure 5:
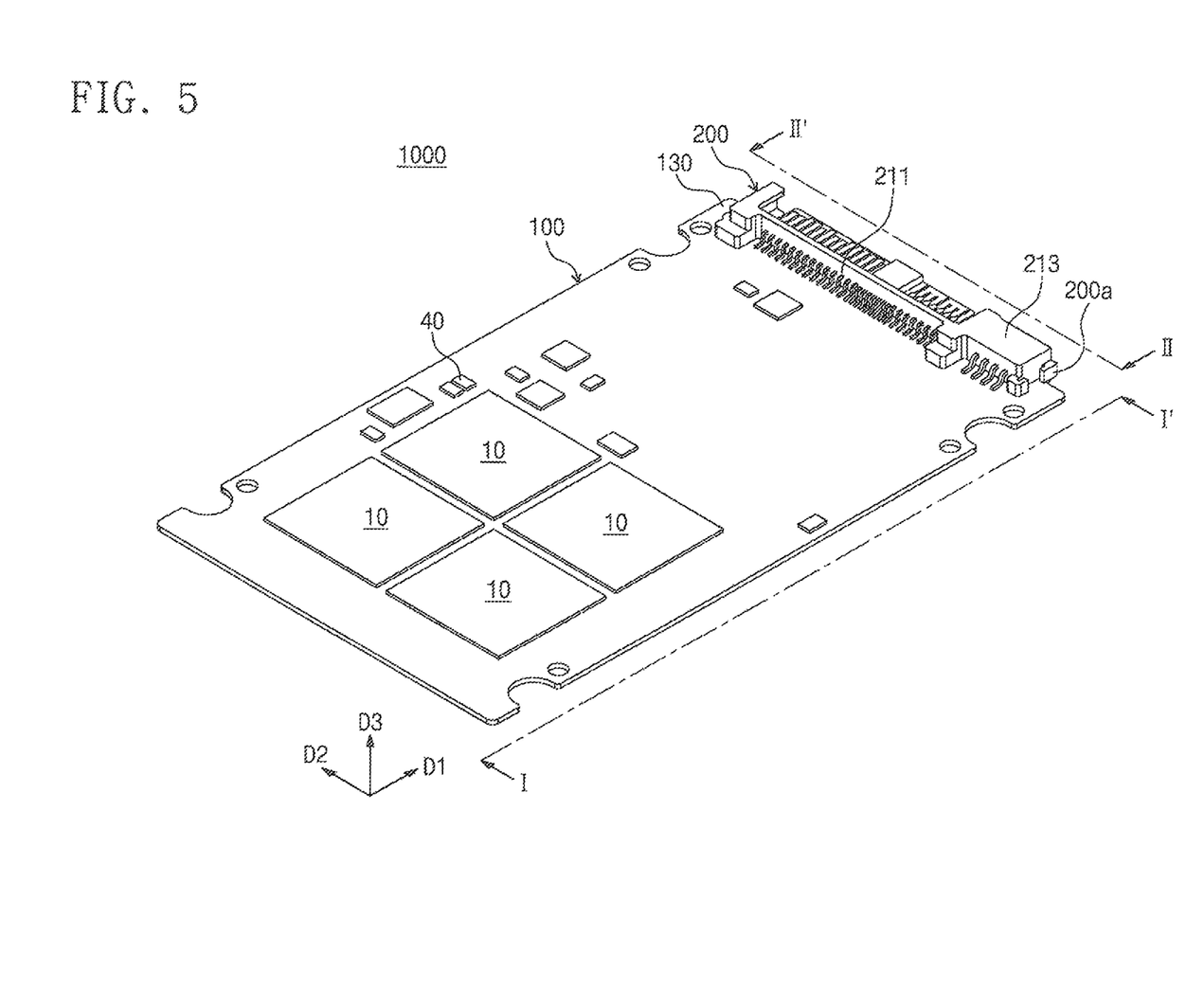
FIGS. 5 and 6 are perspective views illustrating a solid state drive according to example embodiments of the present inventive concepts.
Figure 6:
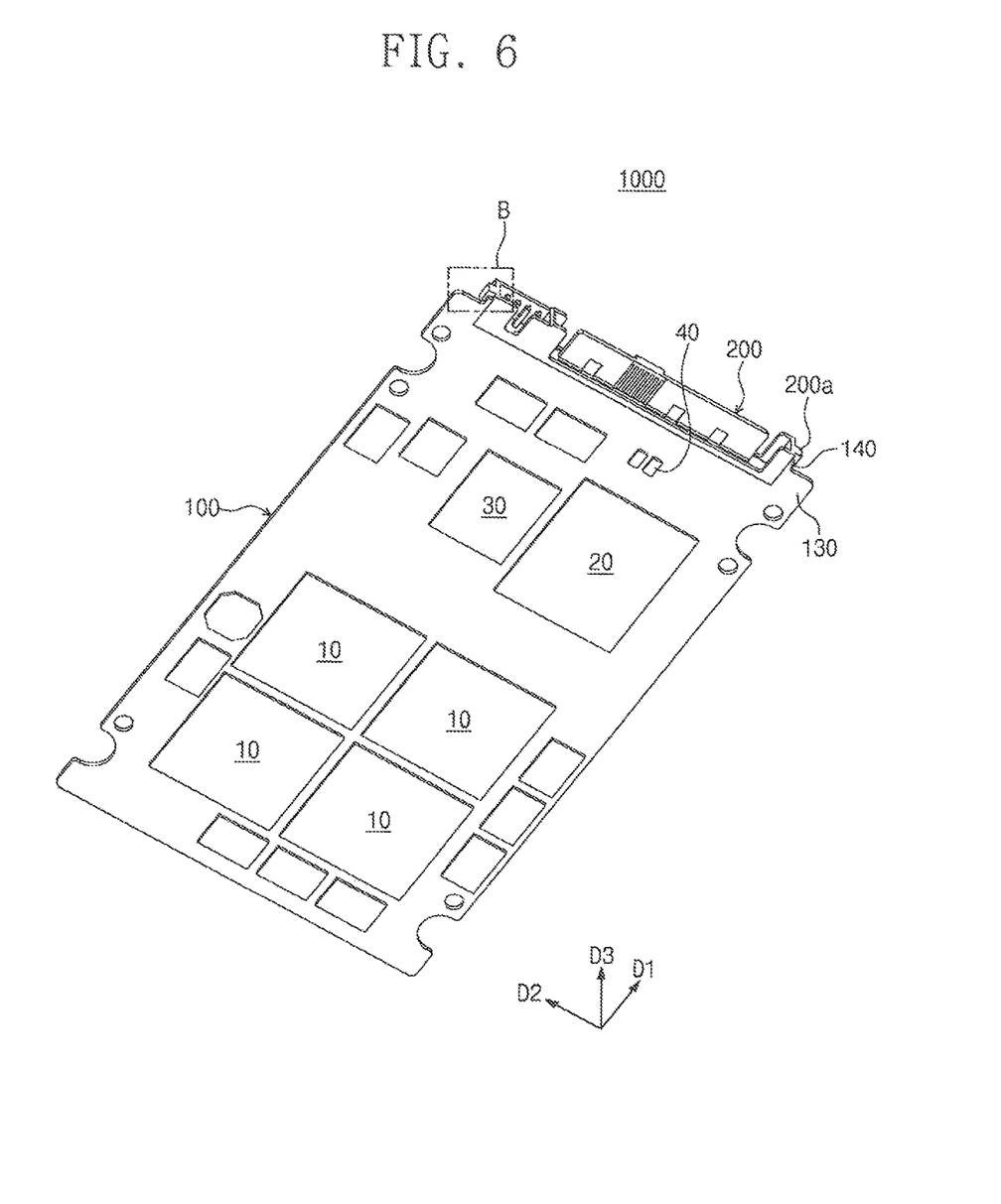
Figure 7:
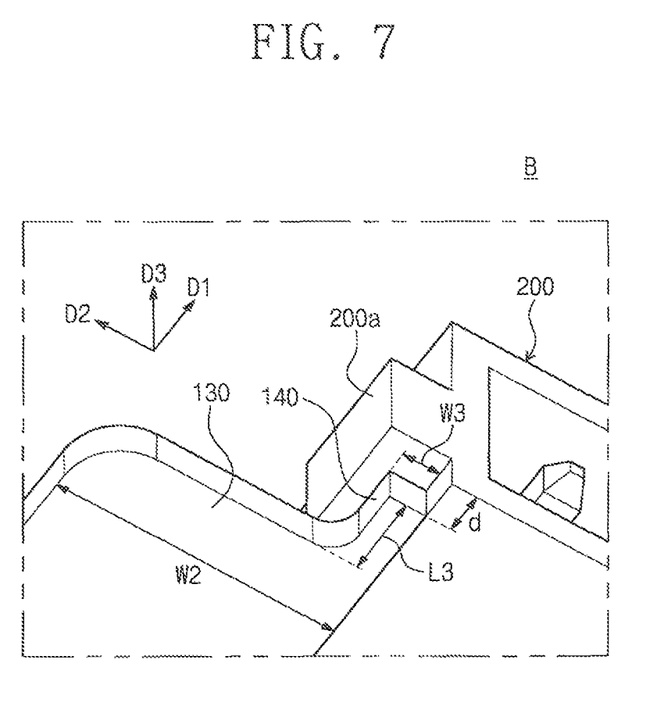
FIG. 7 is an enlarged view of the portion B shown in FIG. 6.
Figure 8:
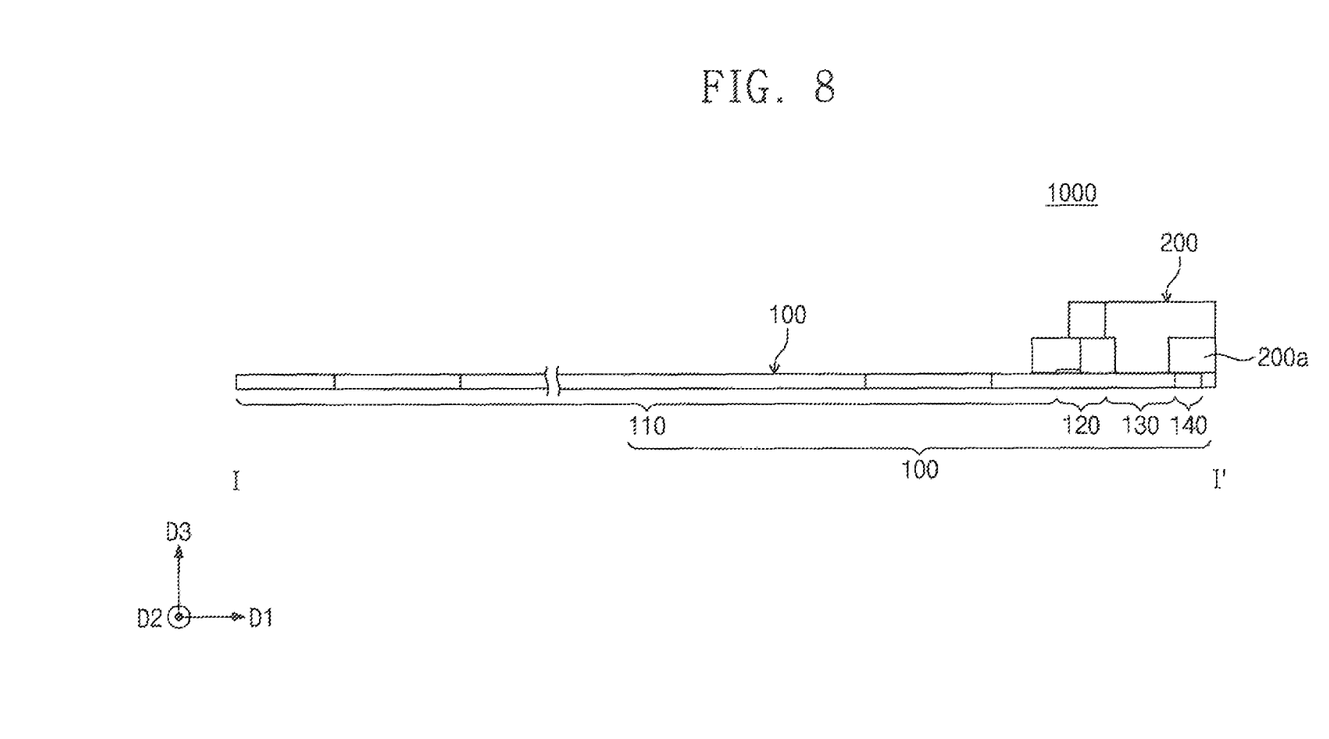
FIG. 8 is a front view viewed from the line I-I' of FIG. 5.
Figure 9:
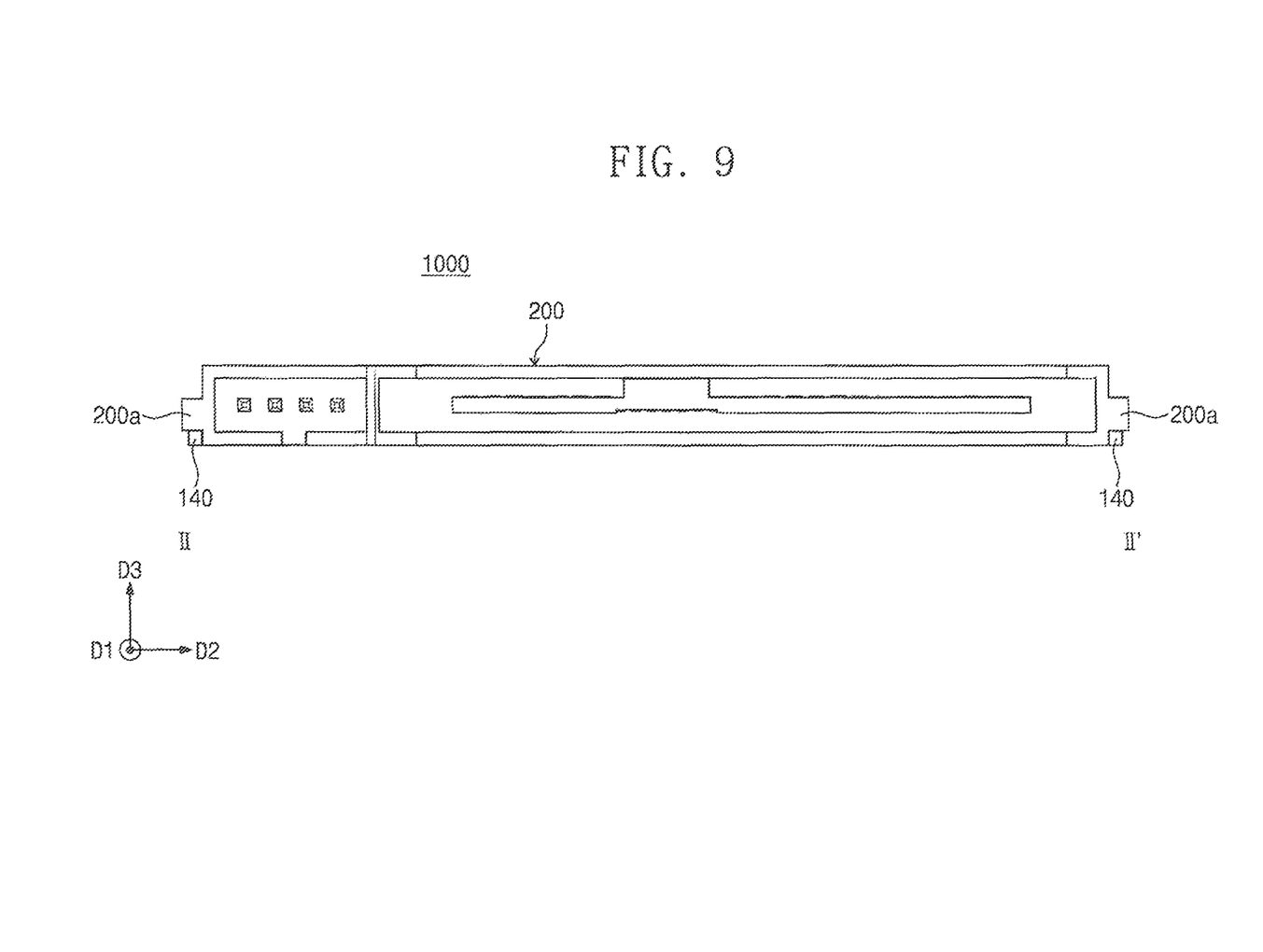
FIG. 9 is a side view viewed front the line II-II' of FIG. 5.

FIG. 4 is an exploded perspective view illustrating a solid state drive according to example embodiments of the present inventive concepts. FIGS. 5 and 6 are perspective views illustrating a solid state drive according to example embodiments of the present inventive concepts. FIG. 7 is an enlarged view of the portion B shown in FIG. 6. FIGS. 8 and 9 are perspective views illustrating a solid state drive according to example embodiments of the present inventive concepts. FIG. 8 is a cross-sectional view viewed from the line I-I' of FIG. 5, and FIG. 9 is a cross-sectional view viewed from the line II-II' of FIG. 5.

Referring to FIGS. 4, 5, and 6, a solid state drive 1000 may include a printed circuit board 100, nonvolatile memory chips 10, a controller chip 20, a buffer memory chip 30, passive devices 40, and an interface connector 200.

The printed circuit board 100 may include, as discussed with reference to FIGS. 1 and 2, a base portion 110, an edge portion 120 at one side of the base portion 110, guide portions 130 protruding in a first direction D1 from opposing ends of the edge portion 120, and protrusions 140 each of which protruding in the first direction D1 from one of the guide portions 130. As discussed, above, the protrusions 140 may have a third width (i.e., W3 of FIG. 1) less than a second width (i.e., W2 of FIG. 1) of the guide portions 130, and a distance D in a second direction D2 between the protrusions 140 may be substantially the same as that D in the second direction D2 between the guide portions 130.

The interface connector 200 may include connector leads 211 and a housing 213 that protects the connector leads 211. The housing 213 of the interface connector 200 may have edge tabs 200a on its opposing sides.

The housing 213 of the interface connector 200 may be provided on a connector interconnecting region of the printed circuit board 100. The connector leads 211 of the interface connector 200 may be mounted on interface pads 121 of the printed circuit board 100. A surface mount technology may be employed to connect the interface connector 200 with the printed circuit board 100.

In detail, referring to FIGS. 7, 8, and 9, the edge tabs 200a of the interface connector 200 may be positioned on the guide portions 130 and the protrusions 140 of the printed circuit board 100. In other words, the edge tabs 200a of the interface connector 200 may be placed on top surfaces of the guide portions 130 and on top surfaces of the protrusions 140 of the printed circuit board 100. The housing 213 of the printed circuit board 100 may be in partial contact with inner sidewalls 130b and 140b of the guide portions 130 and the protrusions 140.

In addition, as shown, in FIGS. 7 and 8, ends of the protrusions 140 of the printed circuit board 100 may be spaced apart from an outer sidewall of the interface connector 200 in the first direction D1. To put it another way, a total length (L2+L3) in the first direction D1 of the guide portion 130 and the protrusion 140 may be less than a width of the interface connector 200. A distance d between the outer sidewall of the interface connector 200 and the end of the protrusion 140 of the printed circuit board 100 may be less than the third length L3 of the protrusion 140. In some embodiments, the ends of the protrusions 140 of the printed circuit board 100 may be substantially coplanar with the outer sidewall of the interface connector 200.

According to example embodiments, as the printed circuit board 100 has the protrusions 140, it may be possible to reduce a ratio of length (D of FIG. 1) to width (L2+L3 of FIG. 1) of the connector interconnecting region defined by the edge portion 120, the guide portions 130, and the protrusions 140. Accordingly, even though the interface connector 200 has an increased ratio of its length to its width, when the interface connector 200 is mounted on the edge portion 120 of the printed circuit board 100, the edge tabs 200a of the interface connector 200 may be stably placed on the guide portions 130 and the protrusions 140 of the printed circuit board 100. As a result, during surface-mounting the connector leads 211 of the interface connector 200 on the interface pads 121 of the printed circuit board 100, the interface connector 200 may not be separated from the printed circuit board 100. Moreover, when repair is attempted on the interface connector 200 mounted on the printed circuit board 100, the interface connector 200 may be easily detached from the printed circuit board 100 just by removing solders joined with the connector leads 211 of the interface connector 200.

In some embodiments, the interface connector 200 may be one of SAS (Serial Attached SCCI), SATA, and PCIe connectors. A size of the interface connector 200 may be standardized in accordance with an international standard. A ratio of length to width may be about 4.8:1 for the SATA connector, about 3.8:1 for the PCIe connector, and about 5.7:1 for the SAS connector. As discussed above, depending on various standards of the interface connector 200, the printed circuit board 100 may be varied in distances between the guide portions 130 and lengths of the guide portions 130 and the protrusions 140.

In some embodiments, an SAS connector 200 may be mounted on the printed circuit board 100, and the edge tabs 200a of the SAS connector 200 may be placed on the guide portions 130 and the protrusions 140 of the printed circuit board 100.

A plurality of the nonvolatile memory chips 10 may be mounted on top and bottom surfaces of the base portion 110 of the printed circuit board 100. Each of the nonvolatile memory chips 10 may include input/output pads for transmitting signals and be electrically connected to chips pads (e.g., 111 of FIG. 1) of the printed circuit board 100. The nonvolatile memory chips 10 may be, for example, Flash memory chips such as NAND, VNAND (Vertical NAND) or three-dimensional NAND.

The controller chip 20 may be mounted on the top or bottom surface of the base portion 110 of the printed circuit board 100. The controller chip 20 may include a central processing unit (CPU), an internal memory, a buffer memory control unit, a host interface, and/or a flash interface. The controller chip 20 may be electrically connected to the plurality of the nonvolatile memory chips 10 and the buffer memory chip 30.

The controller chip 20 may include a program that can communicate signals with an external device using communication standard such as SATA (Serial Advanced Technology Attachment) standard, PAT (Parallel Advanced Technology Attachment) standard, or SCSI (Small Computer System Interface) standard. The SATA standard may include all of SATA-based standards such as so-called SATA-2, SATA-3, e-SATA (external SATA) as well as SATA-1. The PATA standard may include all of IDE-based standards such as IDE (Integrated Drive Electronics) and E-IDE (enhanced-IDE).

The buffer memory chip 30 may be mounted on the top or bottom surface of the base portion 110 of the printed circuit board 100. The buffer memory chip 30 may be a volatile memory chip, for example, a DRAM (Dynamic Random Access Memory) chip. In some embodiments, one of PRAM, RRAM, FeRAM, and MRAM chips may be utilized as the buffer memory chip 30.

The nonvolatile memory chips 10, the controller chip 20, and the buffer memory chip 30 may be mounted on the base portion 110 of the printed circuit board 100 in a mount manner such as ball grid array (BGA), pin grid array (PGA), tape carrier package (TCP), chip-on-board (COB), quad flat package (QFP), or quad flat non-leaded (QFN).

In addition, the passive devices 40 may be mounted on the top and/or bottom surface of the base portion 110 of the printed circuit board 100. The passive devices 40 may include resistor, capacitor, inductor, thermistor, oscillator, ferrite bead, antenna, varistor, and/or crystal. The present inventive concepts, however, are not limited to the above; for example, any otherwise passive devices may be mounted. The passive devices 40 may be electrically connected to the controller chip 20 and the buffer memory chip 30 through the internal circuit routings of the printed circuit board 100.

In some embodiments, a easing may receive the printed circuit board 100 on which the interface connector 200 and the semiconductor chips 10, 20, 30, and 40 are mounted. The casing may be composed of a metallic material, a thermosetting polymer, or a composite material of metal and polymer.

According to example embodiments of the present inventive concepts, a printed circuit board may have protrusions protruding from guide portions that define an interconnecting region on which an interface connector is disposed. Therefore, when the interface connector, is mounted on the printed circuit board, the interface, connector may be stably placed on the guide portions and the protrusions of the printed circuit board. As a result, during mounting of the interface connector, the interface connector may not be separated from the printed circuit board.

Although the present invention has been described in connection with the embodiments of the present invention illustrated in the accompanying drawings, it will be understood to those skilled in the art that various changes and modifications may be made without departing from the technical spirit and essential feature of the present invention. The above-disclosed subject matter is to be considered illustrative, and not restrictive, and the appended claims are intended to cover all such modifications, enhancements, and other embodiments, which fall within the true spirit and scope of the present inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A printed circuit board comprising:
   a base portion including chip pads that are configured to be connected to semiconductor chips;
   an edge portion extending from one side of the base portion, the edge portion including interface pads;
   guide portions, each of the guide portions protruding from a respective one of opposing ends of the edge portion in a first direction and having a first width, and the guide portions being spaced apart from each other; and
   protrusions, each of the protrusions protruding from a respective one of the guide portions and having a second width that is less than the first width, wherein each of the guide portions is between the edge portion and one of the protrusions, and
   wherein a distance between the protrusions is substantially equal to a distance between the guide portions.

2. The printed circuit board of claim 1, wherein each of the guide portions comprises an inner sidewall that is substantially coplanar with an inner sidewall of a respective one of the protrusions.

3. The printed circuit board of claim 1, wherein each of the guide portions comprises an outer sidewall that is substantially coplanar with an outer sidewall of the edge portion.

4. The printed circuit board of claim 1, wherein each of the guide portions has a first length in the first direction, and each of the protrusions has a second length in the first direction, and
   wherein the second length is less than the first length.

5. The printed circuit board of claim 4, wherein a ratio of the distance between the guide portions to a sum of the first and second lengths is in a range of about 5.0:1 to about 6.0:1.

6. A solid state drive comprising:
   a printed circuit board including:
      a base portion;
      an edge portion on one side of the base portion;
      guide portions, each of the guide portions protruding from a respective one of opposing ends of the edge portion in a first direction, and the guide portions being spaced apart from each other; and
      protrusions, each of the protrusions protruding from a respective one of the guide portions in the first direction;
   an interface connector connected to the edge portion of the printed circuit board, the interface connector including edge tabs, and each of the edge tabs contacting a respective one of the guide portions and a respective one of the protrusions;
   a plurality of nonvolatile memory chips mounted on the base portion of the printed circuit board; and
   a controller chip mounted on the base portion of the printed circuit board and electrically connected to the nonvolatile memory chips.

7. The solid state drive of claim 6, wherein each of the guide portions of the printed circuit board has a first width, and each of the protrusions has a second width that is less than the first width, and
   wherein a distance between the protrusions is substantially equal to a distance between the guide portions.

8. The solid state drive of claim 6, wherein each of the guide portions of the printed circuit board has a first length in the first direction, and each of the protrusions has a second length in the first direction, and
   wherein the second length is less than the first length.

9. The solid state drive of claim 6, wherein the protrusions of the printed circuit board have ends that are spaced apart from an outer sidewall of the interface connector in the first direction.

10. The solid state drive of claim 6, wherein the interface connector is a SAS (Serial Attached SCSI) connector.

11. The solid state drive of claim 6, wherein each of the guide portions of the printed circuit board comprises an inner sidewall substantially coplanar with an inner sidewall of a respective one of the protrusions.

12. The solid state drive of claim 11, wherein the inner sidewalls of the guide portions and the inner sidewalls of the protrusions of the printed circuit board partially contact the interface connector.

13. The solid state drive of claim 6, wherein each of the guide portions of the printed circuit board comprises an outer sidewall substantially coplanar with an outer sidewall of the edge portion.

14. The solid state drive of claim 6, wherein the printed circuit board further comprises interface pads disposed on the edge portion, and
wherein the interface connector comprises connector leads electrically connected to the interface pads.

15. The solid state drive of claim 6, further comprising a buffer memory chip mounted on the base portion of the printed circuit board and electrically connected to the non-volatile memory chips and the controller chip.

16. A printed circuit board comprising:
a base portion including chip pads;
an edge portion on one side of the base portion, the edge portion including interface pads; and
two protruding portions defining a recess therebetween, each of the two protruding portions protruding from a respective one of opposing ends of the edge portion in a first direction and comprising an inner sidewall defining the recess and an outer sidewall opposite the inner sidewall, the inner sidewalls of the two protruding portions having a first length in the first direction, the outer sidewalls of the two protruding portions having a second length in the first direction, and the first length being greater than the second length,
wherein a length of each of the two protruding portions in the first direction monotonically decreases from the first length to the second length along a direction from the inner sidewall to the outer sidewall.

17. The printed circuit board of claim 16, wherein the outer sidewall of each of the two protruding portions is coplanar with a respective one of opposing sides of the edge portion.

18. The printed circuit board of claim 16, wherein the two protruding portions are spaced apart from each other in a second direction,
wherein each of the two protruding portions has a first width in the second direction adjacent the edge portion of the printed circuit board, and
wherein each of the two protruding portions comprises a longest portion that defines the inner sidewall and has the first length in the first direction, the longest portion has a second width in the second direction, and the first width is greater than the second width.

19. A solid state drive comprising the printed circuit board of claim 18, the solid state drive further comprising an interface connector connected to the edge portion of the printed circuit board,
wherein the interface connector comprises a housing that comprises opposing sides spaced apart from each other in the second direction and an edge tab that protrudes from one of the opposing sides of the housing, and
wherein the edge tab is disposed on the longest portion of one of the two protruding portions and has a third width in the second direction, and the third width is greater than the second width.

20. The printed circuit board of claim 1, wherein each of the guide portions comprises a first side facing the edge portion and a second side opposite the first side, and
wherein the second side of each of the guide portions directly contacts one of the protrusions.

* * * * *